US010825981B2

(12) United States Patent
Karrai et al.

(10) Patent No.: US 10,825,981 B2
(45) Date of Patent: Nov. 3, 2020

(54) ELECTROMECHANICAL ACTUATOR

(71) Applicant: attocube systems AG, Haar (DE)

(72) Inventors: Khaled Karrai, Munich (DE);
Pierre-Francois Braun, Munich (DE);
Georgy Maikov, Haifa (IL)

(73) Assignee: attocube systems AG, Munich (DE)

( * ) Notice: Subject to any disclaimer, the term of this patent is extended or adjusted under 35 U.S.C. 154(b) by 169 days.

(21) Appl. No.: 16/171,575

(22) Filed: Oct. 26, 2018

(65) Prior Publication Data

US 2019/0067554 A1    Feb. 28, 2019

Related U.S. Application Data

(63) Continuation of application No. 14/975,553, filed on Dec. 18, 2015, now Pat. No. 10,134,975.

(30) Foreign Application Priority Data

Dec. 19, 2014    (EP) ..................... 14199202

(51) Int. Cl.
| | | |
|---|---|---|
| *H01L 41/09* | (2006.01) | |
| *F04B 19/00* | (2006.01) | |
| *F04B 43/04* | (2006.01) | |
| *H02N 2/00* | (2006.01) | |
| *H02N 2/02* | (2006.01) | |

(Continued)

(52) U.S. Cl.
CPC ............ *H01L 41/09* (2013.01); *F04B 19/006* (2013.01); *F04B 43/046* (2013.01); *H01L 41/0986* (2013.01); *H02N 2/002* (2013.01); *H02N 2/0055* (2013.01); *H02N 2/026* (2013.01);

(Continued)

(58) Field of Classification Search
CPC ... H01L 41/09; H01L 41/083; H01L 41/0833; H01L 41/0986; H02N 2/0055; H02N 2/026; H02N 2/103; F04B 43/046; F04B 19/006
See application file for complete search history.

(56) References Cited

U.S. PATENT DOCUMENTS

| | | |
|---|---|---|
| 4,449,893 A | 5/1984 | Beckman et al. |
| 4,808,084 A | 2/1989 | Tsubouchi et al. |

(Continued)

FOREIGN PATENT DOCUMENTS

| | | |
|---|---|---|
| DE | 102013101020 A1 | 8/2014 |
| DE | 102013204026 A1 | 9/2014 |
| SU | 995161 | 9/1981 |

OTHER PUBLICATIONS

European Search Report cited in EP Application No. 14199202.4 dated Jun. 16, 2015, pp. 1-9; Cited in parent.

(Continued)

*Primary Examiner* — Bryan P Gordon
(74) *Attorney, Agent, or Firm* — Cooper Legal Group, LLC

(57) ABSTRACT

An electromechanical actuator includes a base part and an oscillation resonator having the shape of a rod. The electromechanical actuator further includes amount for mounting the oscillation resonator to the base part. The mount is configured to bear the oscillation resonator so as to be rotatable around an axis of the oscillation resonator rod relative to the base part. A driver member is mechanically coupled to the oscillation resonator. A slider or a rotator is configured to be moved by the driver member when the oscillation resonator is excited.

15 Claims, 11 Drawing Sheets

(51) Int. Cl.
*H02N 2/10* (2006.01)
*H01L 41/083* (2006.01)

(52) U.S. Cl.
CPC ........... *H02N 2/103* (2013.01); *H01L 41/083* (2013.01); *H01L 41/0833* (2013.01)

(56) References Cited

U.S. PATENT DOCUMENTS

| | | | |
|---|---|---|---|
| 5,416,375 A | 5/1995 | Funakubo et al. | |
| 5,877,579 A | 3/1999 | Zumeris et al. | |
| 6,016,231 A * | 1/2000 | Kanbara | G02B 7/102 359/814 |
| 7,598,656 B2 | 10/2009 | Wischnewskij et al. | |
| 8,604,665 B2 * | 12/2013 | Wischnewskij | H01L 41/083 310/317 |
| 2005/0134146 A1 * | 6/2005 | Mattsson | H02N 2/0015 310/328 |
| 2009/0256445 A1 * | 10/2009 | Kotani | H02N 2/103 310/323.16 |
| 2011/0260579 A1 * | 10/2011 | Petrenko | H01L 41/0986 310/317 |
| 2011/0266926 A1 * | 11/2011 | Uetani | H01L 41/083 310/366 |
| 2017/0019601 A1 * | 1/2017 | Sumioka | H04N 5/23296 |

OTHER PUBLICATIONS

European Search Report cited in corresponding EP Application No. 18157569.7 dated Nov. 2, 2018; 5 pages.

\* cited by examiner

ELECTROMECHANICAL ACTUATOR

RELATED APPLICATIONS

This application claims priority to and is a continuation of U.S. application Ser. No. 14/975,553, filed on Dec. 18, 2015, entitled "ELECTROMECHANICAL ACTUATOR", which claims priority to European Patent Application 14199202.4, filed on Dec. 19, 2014, and both U.S. application Ser. No. 14/975,553 and European Patent Application 14199202.4 are incorporated herein by reference.

TECHNICAL FIELD

The invention relates to an electromechanical actuator and a method of moving an object relative to a base part.

BACKGROUND

Utilizing the piezoelectric effect for displacing or moving an object is well known in the art. In particular, electromechanical actuators may be designed as vibrators to be used as a driver in micromotors or ultrasound motors. Such piezoelectric motors may be used in many applications, in particular if small dimensions, high movement speed or specific environmental conditions (e.g. vacuum, high or low temperature, lubricant-free operation, etc.) are to be met.

BRIEF DESCRIPTION OF THE DRAWINGS

The accompanying drawings are included to provide a further understanding of embodiments. The drawings illustrate embodiments and together with the description serve to explain principles of embodiments. Other embodiments and many of the intended advantages of embodiments will be readily appreciated as they become better understood by reference to the following description. The elements of the drawings are not necessarily to scale relative to each other. Like reference numerals designate corresponding similar parts.

In the following description, reference is made to the accompanying drawings, which form a part thereof, and in which is shown by way of illustration specific embodiments in which the invention may be practiced. In this regard, directional terminology, such as "top", "bottom", "left", "right", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense.

It is to be understood that the features of the various exemplary embodiments described herein may be combined with each other, unless specifically noted otherwise.

As employed in this specification, the terms "mounted", "attached", "connected", "coupled" and/or "electrically connected/electrically coupled" are not meant to mean that the elements or layers must directly be contacted together; intervening elements or layers may be provided between the "mounted", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "mounted", "attached", "connected", "coupled" and/or "electrically connected/electrically coupled" elements, respectively.

Figure 16:
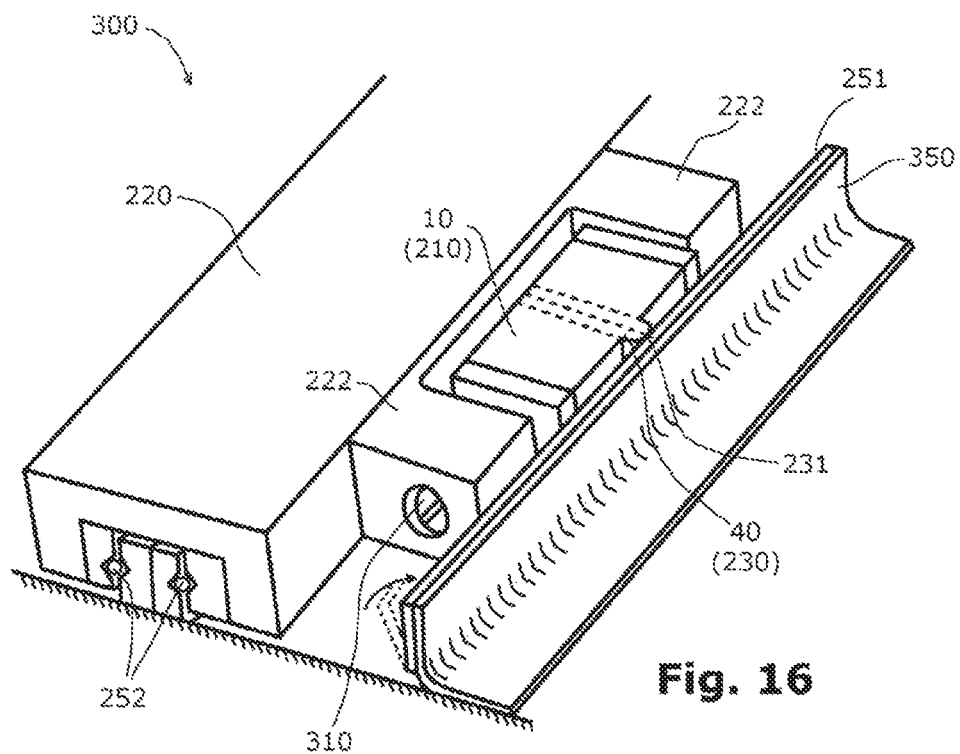

FIG. 16 is a perspective view of an exemplary electromechanical actuator illustrating a self-alignment mount in accordance with an exemplary embodiment.

Figure 17:
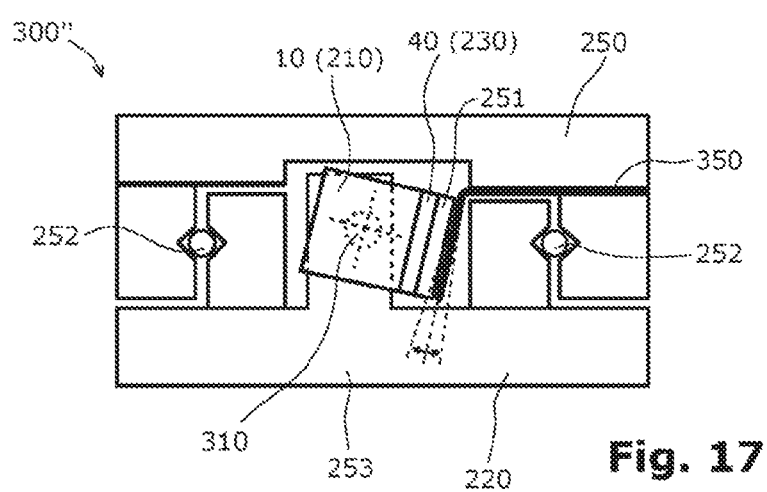

FIG. 17 is a cross sectional view of an exemplary electromechanical actuator similar to the one shown in FIG. 16.

DESCRIPTION OF EMBODIMENTS

It may be an object to provide a simple, robust and powerful electromechanical actuator with high versatility. In particular, it may be an object to provide an electromechanical actuator configured to drive an object via frictional impact with high precision and repeatability.

In accordance with one embodiment, an electromechanical actuator may comprise an oscillation resonator having the shape of a rod, the oscillation resonator being divided by a dividing plane that is not parallel to the longitudinal direction of the oscillation resonator into a first resonator portion and a second resonator portion. At least the first resonator portion comprises electromechanical means which, when activated, are configured to generate a 3-dimensional acoustic bulk wave with a mode shape asymmetric with respect to the dividing plane.

Thus, the first resonator portion, when activated, forms an asymmetric generator of an asymmetric 3-dimensional vibrational elastic (i.e. acoustic) standing wave which has at least one resonance frequency that deforms the oscillation resonator such that mechanical energy may be transferred to an object to be moved. The term asymmetric refers to the dividing plane dividing the oscillation resonator into the first and second resonator portions.

The generation of a 3-dimensional vibrational wave (also referred to in the following as 3D wave) may have several advantages over the generation of a 2-dimensional vibrational wave (in the following also referred to as 2D wave) for various applications of oscillation resonators. One advantage is that the oscillation resonator may have the shape of a rod, whereas a 2-dimensional oscillation resonator necessitates the shape of a plate. As a rod may have a higher degree of symmetry than a plate (e.g. may have four or more symmetry axis oriented perpendicular to the longitudinal axis), the geometry of a rod may provide better pre-conditions for mounting the oscillating resonator to a base part and/or for impulse transfer from the oscillation resonator to an object to be moved. Further, as will be better understood in the following, some applications of 3-dimensional wave oscillation resonators such as, e.g., application which rely on the generation of a radially symmetric wave (i.e. a "breathing" mode of the oscillation resonator) are not available by 2-dimensional wave oscillation resonators.

According to one embodiment, the second resonator portion also comprises electromechanical means, and the electromechanical means of the first and second resonator portions are configured to be activated independently from each other. This implementation may cause the resonator to generate and sustain two asymmetric 3-dimensional vibrational standing waves. These two asymmetric 3-dimensional vibrational standing waves, if selectively activated, may be used to reverse the direction of motion of an object to be moved.

By way of example, the rod-shaped oscillation resonator may be of a cross section which may be nearly or completely a circular disc or a regular polygon, in particular a square. These and other resonator geometries allow the generation of 3-dimensional bulk waves. In contrast to 2-dimensional waves, the 3-dimensional bulk waves generated in the oscillation resonator at resonance frequency may be nearly or completely radially symmetric in any cross section normal to the longitudinal direction of the oscillation resonator.

More specifically, according to one embodiment, the oscillation resonator may have a length L, a first lateral dimension W and a second lateral dimension H in a direction perpendicular to the first lateral dimension W. The first lateral dimension W and the second lateral dimension H may be different from each other by equal to or less than 15%, 10%, 5% or 0%. The smaller the difference between H and W, the stronger is the resonance and the greater is the material displacement (amplitude) at resonance in the oscillation resonator.

According to one embodiment, L is different from W+H by equal to or less than 30%, 15%, 10%, 5% or 0%. In particular, a specific choice may be L=2 W with W=H.

According to one embodiment, the first resonator portion has a length L1, a first lateral dimension W1 and a second lateral dimension H1 in a direction perpendicular to the first lateral dimension W1, and the second resonator portion has a length L2, a first lateral dimension W2 and a second lateral dimension H2 in a direction perpendicular to the first lateral dimension W2, wherein L1, L2 and/or W1, W2 and/or H1, H2 are different from each other by equal to or less than 30%, 15%, 10%, 5% or 0%.

According to one embodiment, the electromechanical means of the first resonator portion comprises a first piezoelectric stack having first electrode layers and first piezoelectric layers disposed therebetween, wherein a polarization vector of a first piezoelectric layer has a component extending in the longitudinal direction of the oscillation resonator. Using a piezoelectric stack for the first resonator portion allows to generate longitudinal and lateral displacements with high amplitude during the vibrational 3D mode of operation, while keeping the excitation voltage at moderate level. Low excitation voltage is advantageous for many reasons. Byway of example, low excitation voltage reduces the risk of electrical sparkovers and therefore increases the range of potential applications.

It is to be noted that throughout this specification the meaning of "a quantity A is different from a quantity B by equal to or less than P %" is that $2|A-B|/(A+B) \leq P/100$.

In one embodiment the electromechanical means of the second resonator portion comprises a second piezoelectric stack having second electrode layers and second piezoelectric layers disposed therebetween, a polarization vector of a second piezoelectric layer has a component extending in the longitudinal direction of the oscillation resonator, the electrode layers of the first piezoelectric stack and the electrode layers of the second piezoelectric stack each comprise a first group of electrode layers and a second group of electrode layers, the electrode layers of the first group and the second group are interlaced, the electrode layers of the first groups are electrically interconnected and the electrode layers of the second groups are electrically separated and configured to be individually excited. That way, by individually exciting the second group electrode layers of the first piezoelectric stack and the second group electrode layers of the second piezoelectric stack, the first resonator portion and the second resonator portion is activated to function as an asymmetric 3D wave generator, respectively.

It is further possible that the oscillation resonator is configured to generate a controllable non-oscillating displacement of the first and/or second resonator portion in the longitudinal direction of the first and/or second resonator portion when activated in a non-oscillating condition. This non-vibrational mode allows the electromechanical actuator to precisely adjust a final position of an object, e.g. a slider, to a target position after the long range movement in the vibrational mode has been completed.

The electromechanical actuator may further comprise a driver member mechanically coupled to the oscillation resonator and a slider or rotator configured to be moved by the driver member when the oscillation resonator is excited. That way, the 3-dimensional bulk standing wave generated in the oscillation resonator may be used to linearly displace a slider or to rotate a rotator via the driver member which transfers a specific component of the vibrational impulse of the oscillation resonator to the slider or rotator, respectively.

The driver member may be configured to engage with a friction surface of the slider or the rotator via a frictional contact. The frictional contact may be used to transform the vibrational motion into a linear motion or into a rotation. In contrast to a 2-dimensional wave oscillation resonator, which has to be of the shape of a plate where the driver member has to be located at the (small) thickness dimension of the plate, here the driver member may, e.g., be located at any of the longitudinal rod faces and thus may provide for a substantial greater frictional contact area than in the 2D wave case.

In one embodiment, the friction surface of the slider or rotator may be spring-loaded to control the frictional contact between the driver member and the friction surface. The spring, e.g. a leaf spring, may be used to control the pressure and/or the orientation between the friction surface and the driver member which is motionally coupled to the oscillation resonator.

The electromechanical actuator may further comprise a base part and a mount for mounting the oscillation resonator to the base part, wherein the mount is configured to bear the oscillation resonator so as to be rotatable around an axis of the rod relative to the base part. That way, a positioning mount may be established which is capable to self-align the frictional contact between the driver member coupled to the oscillation resonator and the friction surface at the slider or rotator. This self-alignment may greatly improve the stability and reproducibility of the frictional contact and may therefore reduce uneven wear or abrasion and extend lifetime duration or maintenance intervals of the electromechanical actuator.

According to one aspect, a method of moving an object relative to a base part is disclosed. The method may comprise providing an oscillation resonator having the shape of a rod, the oscillation resonator being divided by a dividing plane that is not parallel to the longitudinal direction of the oscillation resonator into a first resonator portion and a second resonator portion. The method may further comprise activating the electromechanical means so as to generate a 3-dimensional acoustic bulk wave with a mode shape asymmetric with respect to the dividing plane. That way, a low-maintenance and robust method of moving an object with a high degree of precision, repeatability and having a high potential of miniaturization is provided.

Figure 1:
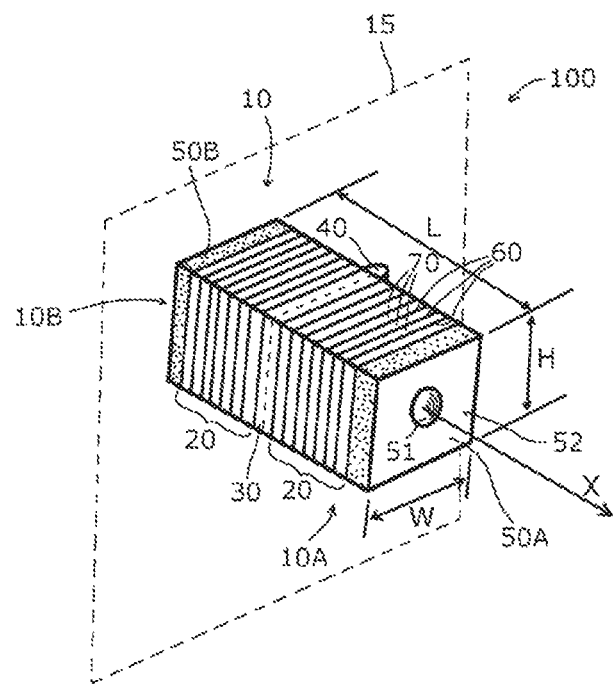
FIG. 1 is a perspective view of an oscillation resonator having the form of a square cross sectional rod in accordance with an exemplary embodiment.

FIG. 1 illustrates by way of example an electromechanical actuator 100. The electromechanical actuator 100 comprises an oscillation resonator 10 having the shape of a rod with length L, width W and height H. The oscillation resonator 10 may be divided by a dividing plane 15 into a first resonator portion 10A lying, in FIG. 1, in front of the dividing plane 15 and a second resonator portion 10B lying, in FIG. 1, behind the dividing plane 15.

The dividing plane 15 is not parallel to the longitudinal direction or axis X of the oscillation resonator 10. In particular, the dividing plane 15 may be normal to X. Further, the dividing plane 15 may, e.g., be a symmetry plane, i.e. the first resonator portion 10A may be identical with the second resonator portion 10B.

The first resonator portion 10A may have a length L1 and the second resonator portion 10B may have a length L2, with L1+L2=L. The first and second resonator portions 10A, 10B each may have the shape of a rod. Byway of example, the first resonator portion 10A may have a width W1 and the second resonator portion 10B may have a width W2, wherein the specific case W1=W2=W is depicted in FIG. 1 by way of example. Further, the first resonator portion 10A may have a height H1 and the second resonator portion 10B may have a height H2, wherein the specific case H1=H2=H is depicted in FIG. 1 by way of example.

At least one of the resonator portions 10A, 10B may comprise an electromechanical means which, when activated, is configured to generate an elastic standing bulk wave with a mode shape asymmetric with respect to the dividing plane 15. As will be explained further below, a directional motion may be derived by making use of this symmetry breaking. The longitudinal direction of the oscillation resonator 10 is parallel to the central axis X of the rod-shaped oscillation resonator 10.

In the following, by way of example and without restriction of generality, both resonator portions 10A and 10B are exemplified to be equipped with electromechanical means. Further, by way of example and without restriction of generality, the electromechanical means are exemplified by piezoelectric multilayer elements, so-called piezoelectric stacks 20. Piezoelectric stacks 20 are commercially available in the art.

The electromechanical actuator 100 may further comprise a driver member 40. The driver member 40 may be a friction element configured to engage with a frictional surface (not shown) of an object (not shown) to be moved. The driver member 40 may be made of a hard, wear-resistant material such as, e.g., a ceramic or a carbide material. The driver member 40 may protrude out from one side face (e.g. the side face defined by the height dimension H of the oscillation resonator 10) and may run, e.g., along the entire height extension H. This allows to provide for a large frictional contact area, because the height dimension H of the oscillation resonator 10 may have a similar size than the width dimension W (which would not be the case in plate-like resonators for 2D wave generation). The large contact area reduces the issue of force fluctuations due to surface roughness and dust, which represents a major drawback of conventional plate-shaped 2D wave oscillation resonators. Further, the wear of the driver member 40 may also be reduced by this implementation.

According to one embodiment, the oscillation resonator 10 comprises one monolithic piezoelectric stack reaching through the dividing plane 15 and providing both for the electromechanical means of the first resonator portion 10A and the electromechanical means of the second resonator portion 10B.

In another embodiment, as is, for example, depicted in FIG. 1, two piezoelectric stacks 20 are provided which are interconnected by a plate 30. A central plane of the plate 30 may be coplanar with the dividing plane 15. By way of example, the plate 30 may be a thin plate of, e.g., ceramic or metal to which the two piezoelectric stacks 20 are glued at both sides. The plate 30 may be cut in a shape substantially that of the H and/or W dimensions of the oscillation resonator 10.

If a plate 30 is used between the two piezoelectric stacks 20 (or, more generally, the electromechanical means), the driver member 40 may be an integral part of the plate 30. In other words, the plate 30 may be designed so as to have the driver member 40 protruding out of a lateral surface of the oscillation resonator 10 at, e.g., a location intersecting the dividing plane 15. This implementation has the advantage of making the driver member 40 (friction element) of any desired shape and also to make it very robust since it is part of the plate 30 which is secured, e.g. glued, to a large area (e.g. the cross sectional area of the rod).

Such oscillation resonator 10 is still rather easy to manufacture, because it may simply be made of two commercially available piezoelectric stacks 20 glued to one central plate 30 shaped to include the driver member 40.

The oscillation resonator 10 may further comprise two endplates 50A, 50B which may, e.g., be made of any of the materials mentioned before in relation to the plate 30. The end plates 50A, 50B may have the same H×W dimensions as the first and/or second resonator portions 10A, 10B. Each end plate 50A, 50B may be equipped with a bearing element 51 located, e.g., at the center of an end surface 52 of the end plate 50A, 50B. By way of example, the bearing elements 51 may be depressions provided in the end surface 52 configured to engage with protrusions of a mount (not shown) to suspend the oscillation resonator 10 in a freely rotatable condition.

The oscillation resonator 10 may be of arbitrary cross-section with, e.g., rotational symmetry (e.g. $D_{\infty h}$ linear with inversion center). The oscillation resonator 10 may also be hollow or annular in cross section. That is, the oscillation resonator 10 may be equipped with a through hole extending axially through the length L of the oscillation resonator 10. By way of example, the through hole may represent a pipe for transporting a fluid through the oscillator resonator 10 or may allow a shaft protruding into or running through the through hole to provide for a pivot bearing.

The piezoelectric stacks 20 may be multilayer piezoelectric elements composed of electrode layers 60 and piezoelectric material layers 70 arranged in an alternating order. The piezoelectric material layers 70 may have a polarization vector having a component extending in the direction of the axis X. In particular, the polarization vector may extend in the direction of the axis X. The electrode layers 60 and the piezoelectric material layers 70 may, e.g., be oriented normal to the axis X, but it is also possible that the electrode layers 60 and the piezoelectric material layers 70 are oriented inclined to the axis X.

Rather than having a square cross-sectional shape, the oscillation resonator 10 as well as the first and/or second portions 10A, 10B thereof may have a any arbitrary cross section of a rod, e.g. a cross-sectional shape of a regular or approximately regular polygon. A regular polygon is a polygon with side faces of equal dimensions.

By way of example, L=20 mm within a range of, e.g., ±15, ±10, or ±5 mm. Further, each of W and H may be equal to 10 mm, within, e.g., a range of ±8 mm, ±5 mm, or ±3 mm. In the following, if not noted otherwise, without loss of generality, L=20 mm, W=W1=W2=10 mm and H=H1=H2=10 mm are used for purpose of example.

Figure 2:
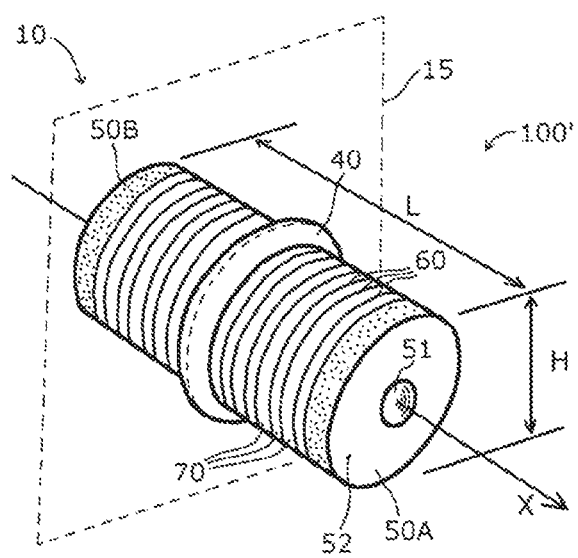
FIG. 2 is a perspective view of an oscillation resonator having the form of a cylindrical rod in accordance with an exemplary embodiment.

FIG. 2 illustrates an electromechanical actuator 100'. Electromechanical actuator 100' may be identical in all features to electromechanical actuator 100 except that the rod-shaped oscillation resonator 10 has a cylindrical shape rather than a square cross-sectional shape. The cylindrical shape may also apply to the plate 30. The plate 30 may be equipped with an integral driver member (frictional element) 40 which may, e.g., partially or completely surround the circumference of the cylindrical oscillation resonator 10. Again, a central plane of the plate 30 may be coplanar with the dividing plane 15, which may be a symmetry plane of the oscillation resonator 10.

It is to be noted that the driver member 40 is not mandatory for the oscillation resonator 10. Instead of using a driver member 40 to transfer a component of vibrational motion to an object, it is also possible that, e.g., a part or the entire circumferential surface of the oscillation resonator 10 may be used to move an object, e.g. a fluid such as, e.g., a liquid or a gas. As will be described in more detail further below, the oscillation resonator 10 may operate in a "breathing" mode in which a 3-dimensional bulk standing wave, which may be radially symmetric in any cross-section normal to the axis X, may be generated. This "breathing" of the oscillation resonator 10, which does not have any equivalent in a 2-dimensional plate oscillation resonator, may, e.g., be exploited for fluid transport operation in a micropump, as will be explained further below in more detail.

Figure 3:
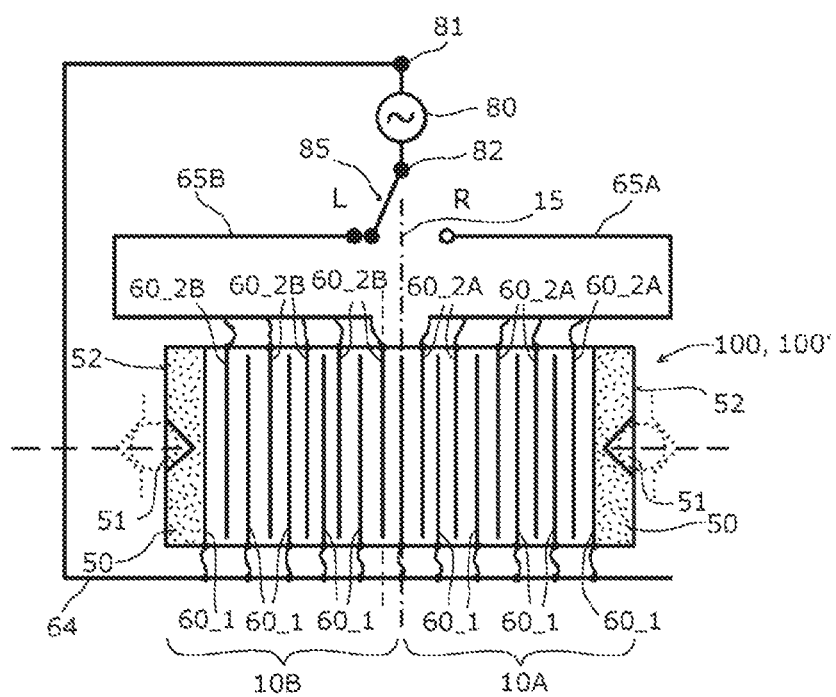
FIG. 3 is a circuit diagram illustrating a control unit and an exemplary electrode configuration and wiring of an oscillation resonator in accordance with an exemplary embodiment.

FIG. 3 illustrates an example of the electrode multilayer structure of the oscillation resonator 10 and a control unit used to activate the oscillation resonator 10.

In the example shown in FIG. 3, the first piezoelectric stack 20 of the first resonator portion 10A and the second piezoelectric stack 20 of the second resonator portion 10B may, e.g., be established by one single monolithic piezoelectric stack. This piezoelectric stack comprises a first group of electrode layers 60_1, which are referred to as common electrodes because they are electrically interconnected by a common conductor 64 and are arranged both in the first resonator portion 10A and the second resonator portion 10B. Further, the oscillation resonator 10 comprises a left second group of electrodes 60_2B and a right second group of electrodes 60_2A. These electrodes are referred to as excitation electrodes as they are configured to selectively activate either the first resonator portion 10A or the second resonator portion 10B. More specifically, the excitation electrodes established by the right second group of electrode layers 60_2A are electrically interconnected by a first conductor 65A and the excitation electrodes established by the left second group of electrode layers 60_2B are electrically interconnected by a second conductor 65B. The right second group of electrode layers 60_2A and the left second group of electrode layers 60_2B are electrically separated from each other. The first group of electrode layers 60_1, i.e. the common electrodes, and the right and left second group of electrode layers 60_2A, 60_2B, i.e. the excitation electrodes, are interlaced, that is, e.g., excitation electrodes and common electrodes are arranged in alternating order. The piezoelectric material layers 70 are arranged between these electrode layers 60, that is each piezoelectric material layer 70 may be sandwiched between one excitation electrode layer 60_2A or 60_2B and one common electrode layer 60_1.

A control unit to activate the oscillation resonator 10 may comprise an alternating voltage generator 80 and, optionally, a selector switch 85. The alternating voltage generator 80 is configured to generate an alternating voltage of frequency f between terminals 81 and 82. Terminal 81 may be coupled to the common conductor 64 and thus to first group of electrode layers 60_1 (common electrodes). The second terminal 82 may be coupled to an input of the selector switch 85. Selector switch 85, if switched to the left position (L), connects second terminal 82 to the left second group of electrode layers 60_2B and, if switched to the right position (R), connects second terminal 82 to the right second group of electrode layers 60_2A. Thus, the selector switch controls the timing of the activation of the first and second resonator portions 10A and 10B, respectively. If only one resonator portion 10A or 10B is equipped with electromechanical means, a disconnecting switch rather than a selector switch may be used.

As already mentioned, the oscillation resonator 10 may be equipped with two separate piezoelectric stacks 20 separated by, e.g., plate 30. In this case, the circuitry is similar to the circuitry illustration of FIG. 3, i.e. the common electrodes of the two piezoelectric stacks 20 are interconnected via the common conductor 64 and the excitation electrodes of the two piezoelectric stacks 20 are electrically separated and individually controllable.

The alternating voltage generator may, e.g., bean autogenerator. An autogenerator may comprise a feedback loop configured to automatically adjust the frequency f of the alternating voltage generator 80 to the resonance frequency of the oscillation resonator 10. In this case, the oscillation resonator 10 creates its own oscillation frequency as will be described further below (see FIGS. 7 and 8). An impedance locking feedback mode may serve to stabilize the frequency f of the alternating voltage generator 80 at resonance.

Figure 4B:
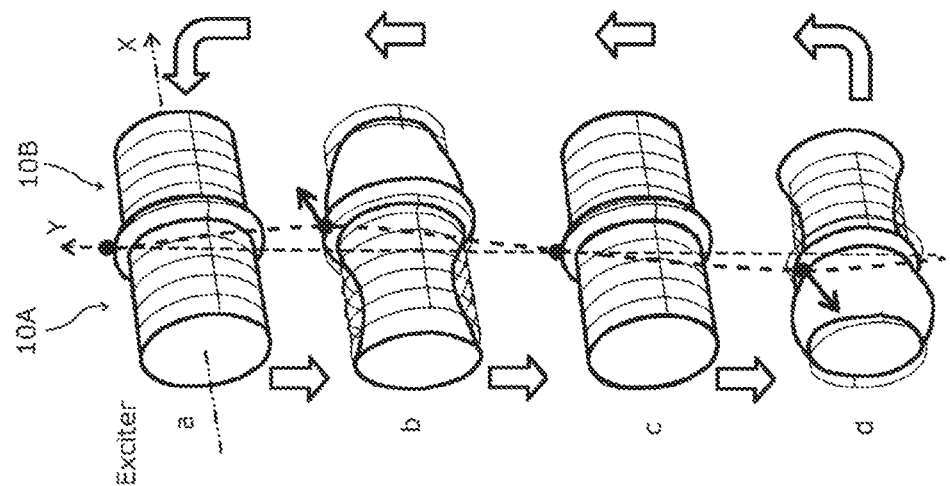
FIGS. 4A and 4B are perspective views of the oscillation resonators of FIGS. 1 and 2, respectively, when activated.
Figure 4A:
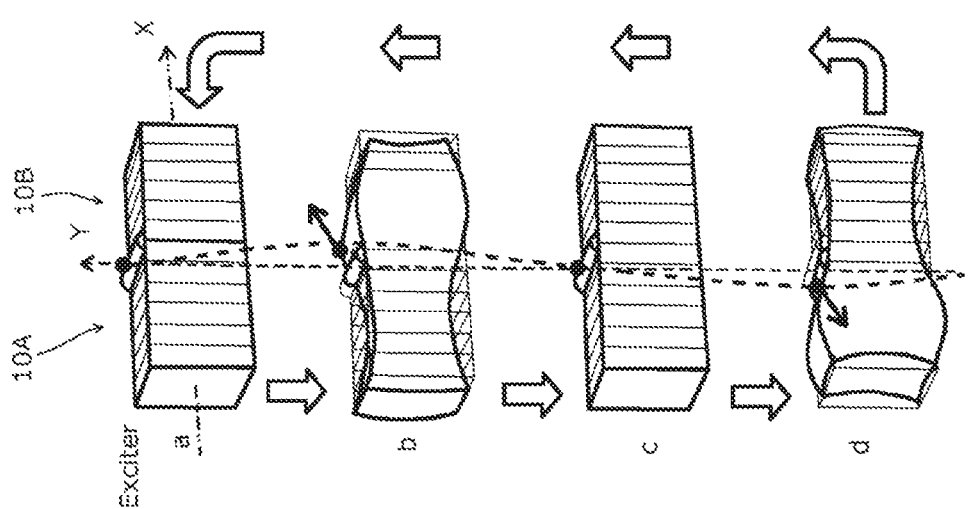

FIG. 4A illustrates the 3D asymmetrical vibrational resonance mode of the oscillation resonator 10 shown in FIG. 1, and FIG. 4B illustrates the 3D asymmetrical vibrational resonance mode of the oscillation resonator 10 shown in FIG. 2. In FIGS. 4A and 4B, always the first resonator portion 10A (in FIGS. 4A, 4B the left hand portion) is activated. The deformation amplitudes are exaggerated for purpose of illustration.

At state a the first resonator portion 10A (in FIGS. 4A, 4B the left hand portion) is activated.

The first resonator portion 10A then dilates in axial direction and, at the same time, contracts in radial direction—it "breathes out" (see state b). Concurrently, the second resonator portion 10B "breathes in".

At state c the resonator 10 oscillates through the undeformed state.

At state d the first resonator portion 10B contracts in axial direction and, at the same time, dilates in radial direction—it "breathes in". Concurrently, the second resonator portion 10B "breathes out".

Then, the process advances through states c and b back to the undeformed state a.

As illustrated in FIGS. 4A and 4B, in any of the cross-sections of the oscillation resonator 10 the elastic 3D (bulk) standing wave manifests itself by a periodic breathing. That is, the radial distribution of the oscillation resonator 10 material in a given cross-section normal to the X axis increases (or decreases) everywhere during the first half period and decreases (increases) everywhere during the second half period. This is the attribute that may make the wave radially symmetric, i.e. the cross-section deforms in an isotropic way that looks like "breathing". This bulk or "breathing" wave sloshes in the oscillation resonator 10 back and forth along the longitudinal direction of the oscillation resonator 10 at the resonance frequency of the "breathing" mode.

It is to be noted that in the 3D wave mode any dimension L, W and H is a resonance dimension, whereas in a 2D wave mode, the dimension normal to the main surface of the plate-shaped 2D resonator is not a resonance dimension. As all dimensions and thus all bulk material participate in the resonance mode, a strong and robust resonance with a comparatively large amplitude may be obtained.

Further differences to the 2D resonance mode will be explained below in conjunction with FIGS. 10 to 12.

Figure 5:
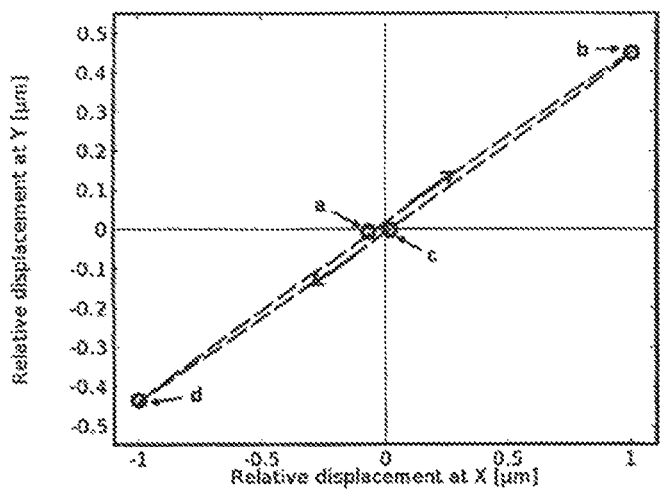
FIG. 5 is a graph illustrating the trajectory of the displacement at X and Y of FIG. 4A, when the left portion of the oscillation resonator is activated.

FIG. 5 illustrates the relative displacement at Y in units of μm versus the relative displacement at X in units of μm for states a, b, c and d. In FIG. 5 the left half (first resonator portion 10A) of the oscillation resonator 10 is the exciter. The impulse transfer is from left to right. While at states a, c, minimum relative displacements at X (longitudinal direction) and Y (transversal direction) are experienced, maximum relative displacements at X and Y are experienced at states b and d.

Figure 6:
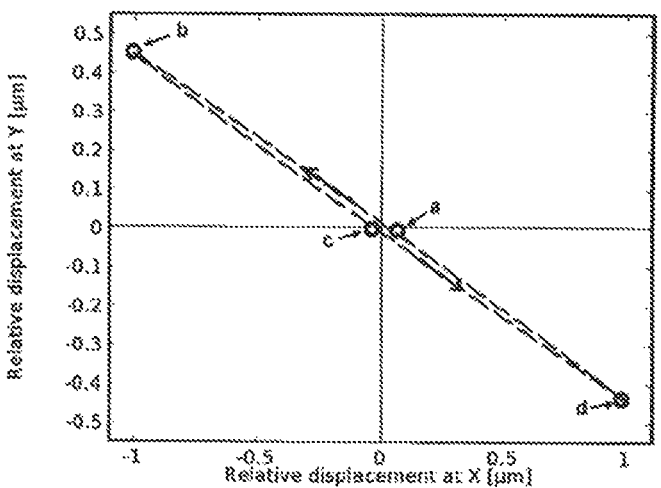
FIG. 6 is a graph illustrating the trajectory of the displacement at X and Y of FIG. 4A, when the right portion of the oscillation resonator is activated.

FIG. 6 is a similar diagram illustrating, however, the case where the right half (second resonator portion 10B) of the oscillation resonator 10 is the exciter. In this case, the impulse transfer is from right to left. Again, maximum relative displacements at X and Y are experienced at states b and d, while minimum relative displacements at X and Y are experienced at states a and c.

Figure 7:
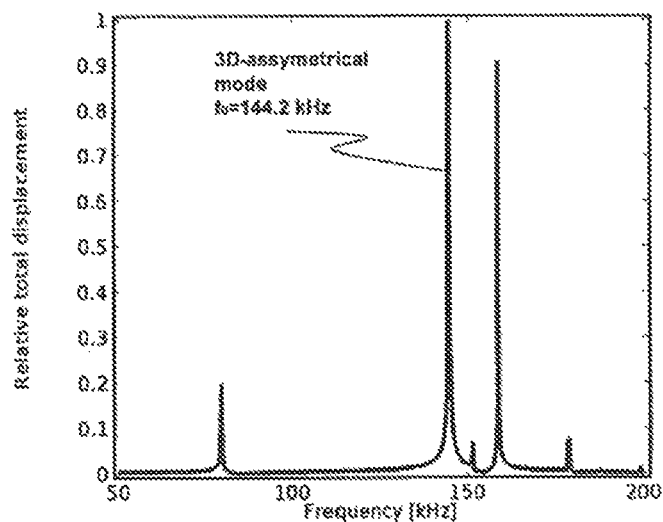
FIG. 7 is a graph illustrating a motional resonance peak experienced in the 3D asymmetrical vibrational mode of the oscillation resonator of FIG. 4A.

FIG. 7 illustrates the motional resonance peak of the 3D asymmetrical vibrational mode. The amplitude of the trajectory in terms of a relative total displacement at, e.g., X or Y is depicted as a function of the frequency f in units of kHz. As it is apparent, resonance is obtained at, e.g., $f_0=144.2$ kHz. The diagram applies for an oscillation resonator 10 rod of square cross section, L=20 mm and W=H=10 mm.

Figure 8:
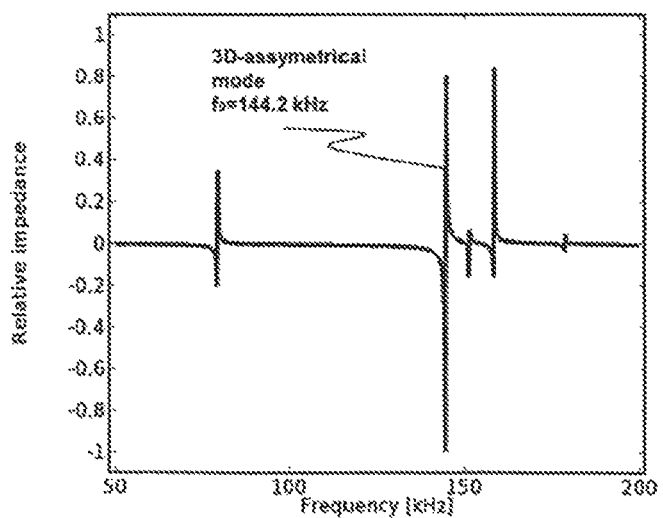
FIG. 8 is a graph illustrating an impedance resonance curve experienced in the 3D asymmetrical vibrational mode of the oscillation resonator of FIG. 4A.

FIG. 8 illustrates the impedance response of the oscillation resonator 10 of FIG. 7. The relative impedance of the oscillation resonator 10 is depicted as a function of frequency in units of kHz. As it is apparent from FIG. 8, the impedance resonance occurs at the same frequency f as the motional resonance peak (FIG. 7). This behavior may be exploited to excite the oscillation resonator 10 at resonance by using an auto resonance control unit (autogenerator) having a feedback loop locking to the 3D asymmetrical mode impedance resonance.

Figure 9:
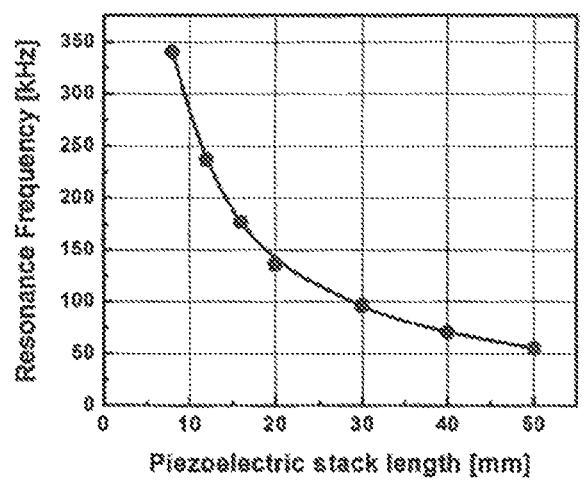
FIG. 9 is a graph illustrating the resonance frequency versus the length of the oscillation resonator as experienced in the 3D asymmetrical vibrational mode of the oscillation resonator of FIG. 4A.

FIG. 9 illustrates the evolution of the resonance frequency in units of kHz as a function of the piezostack length L in units of mm. Again, an oscillation resonator 10 with square cross section of side length 0.5 L is used for purpose of illustration. The shorter L, the higher is the resonance frequency $f_0$ obtained.

Figure 10:
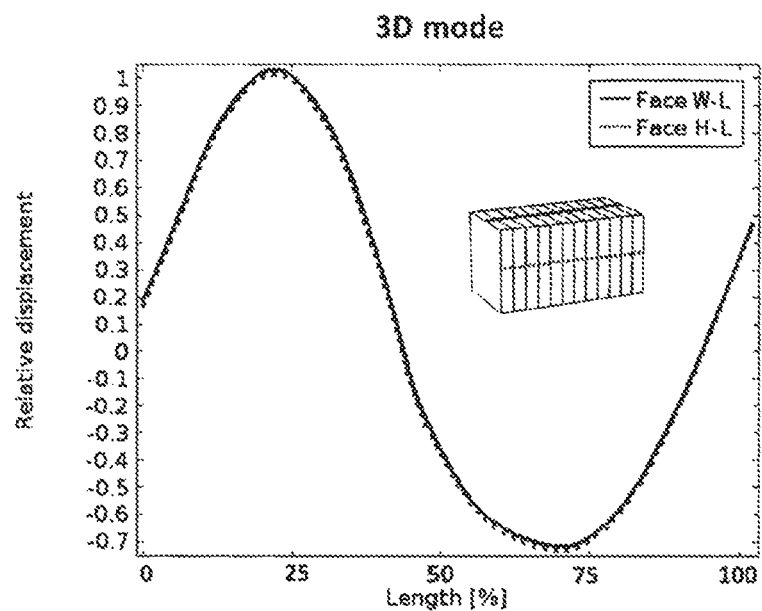
FIG. 10 is a graph illustrating the relative displacement of a first longitudinal rod side face and the relative displacement of a second longitudinal rod side face oriented perpendicular to the first one in the 3D asymmetrical vibrational mode of an oscillation resonator as depicted in FIG. 10.
Figure 11:
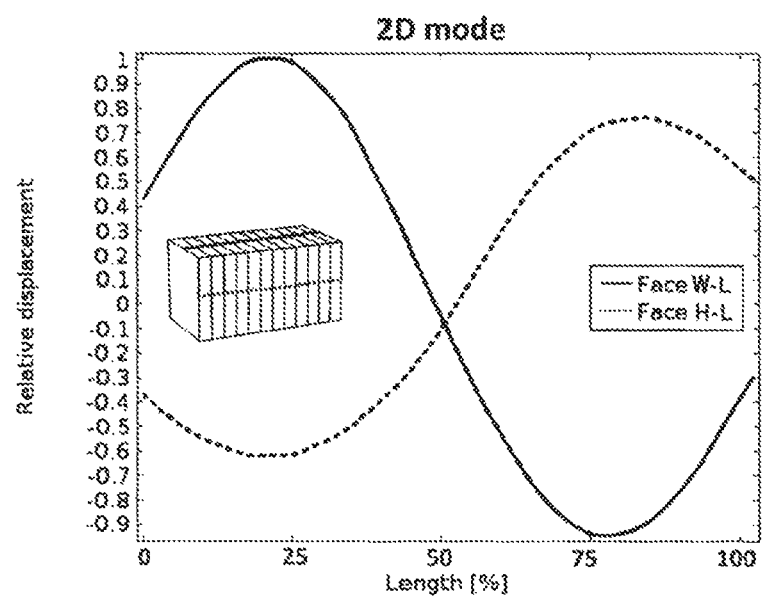
FIG. 11 is a graph illustrating the relative displacement of a first longitudinal rod side face and the relative displacement of a second longitudinal rod side face oriented perpendicular to the first one in the 2D asymmetrical vibrational mode of the same oscillation resonator as shown in FIG. 10.

FIGS. 10 and 11 illustrate the relative displacement at the surface W-L (continuous curve) and at the surface H-L (dotted curve) in the 3D mode and the 2D mode, respectively. The diagrams are based on an oscillation resonator having the shape of a rod (FIG. 10) and on an oscillation resonator having the shape of a plate (FIG. 11). The difference between the 3D mode and the 2D mode is clearly apparent from FIGS. 10 and 11. In the 2D mode the standing waves are radially antisymmetric. That is, in the case of 2D standing waves, the radial distribution is not "breathing". Instead, the material distribution increases along the width W and reduces along the height H during the first half period and decreases along the width W and increases along the height H during the second half period. In contrast to the case of 3D waves, the cross section deforms in an anisotropic way periodically from "tall and slim" to "short and fat". On the other hand, as already mentioned above, 3D mode resonant waves may produce an isotropic deformation of any cross-section of the oscillation resonator 10, see FIG. 10.

Figure 12:
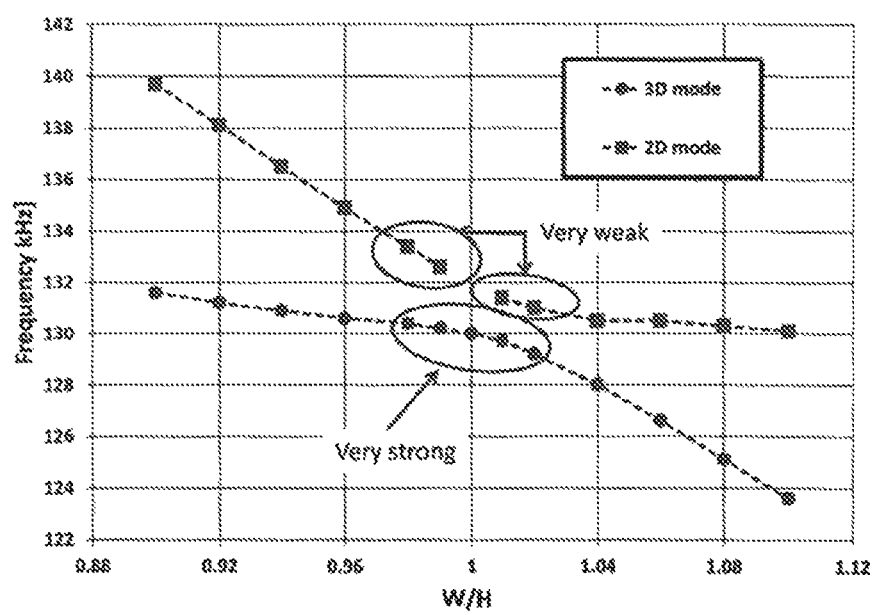
FIG. 12 is a graph illustrating the resonance frequencies for the 3D asymmetrical vibrational mode and the 2D asymmetrical vibrational mode, respectively, versus the dimensional factor W/H, wherein W is the width dimension and H is the height dimension of an oscillation resonator rod.

FIG. 12 illustrates the frequency in units of kHz as a function of the ratio of W to H. The 2D mode resonant wave disappears completely when the width to high ratio W/H is equal to 1. It is very weak in the vicinity of W/H=1, indicating that the 2D mode may be used in a plate but can not practically be used in a rod with W and H having similar values. On the other hand, the 3D mode creating the bulk or "breathing" resonant wave only exists in the vicinity of W/H=1, e.g. in a region where W and H are not different from each other by more than 15%, 10% or 5%.

The bulk or "breathing" wave as created in the 3D mode is sloshing back and forth along the longitudinal axis X of the oscillation resonator 10 (i.e. the rod axis) at the period of the resonance frequency $f_0$ of the 3D mode. Actuating only one of the first or second resonator portions 10A or 10B makes all the points located along the circumference of the rod cross section move in oscillation. For a cylindrical rod (see FIG. 2) for instance, the oscillating trajectories of all points of the circumference of a cross-section are all contained on a portion of a cone which axis is aligned to that of the rod and for which the tip (of the cone) is oriented opposite to the impulse transferred to a body that would be in frictional contact with the points of the circumference. Switching the actuation to the other half of the rod (by switching the selector switch 85) flips conversely the orientation of said cone, thus reversing the direction of operation of a device driven by the oscillating deformation of oscillation resonator 10.

Thanks to this attribute the 3D bulk wave makes it possible for the oscillation resonator 10 rod to displace a fluid unidirectionally inside a pipe extending through the center part of the resonator rod. In the same spirit, the oscillation resonator 10 rod could be used to displace a fluid around its moving circumference. That is, the oscillation resonator 10 rod may be used as a pump or propulsion unit to transfer a fluid from left to right or right to left along the axis of the rod by exploiting inner or peripheral deformation of the rod. It is to be noted that such operation would not be possible with a 2D wave, see FIG. 11. In conclusion, the bulk "breathing" wave created by the 3D asymmetric vibrational mode is very different from the "tall and slim" to "short and fat" wave created by a 2D asymmetrical vibrational mode.

The oscillation resonator 10 may be used as a driver or propulsion unit of an inertial motor. Inertial motors are used, e.g., as micromotors in many applications.

Figure 13:
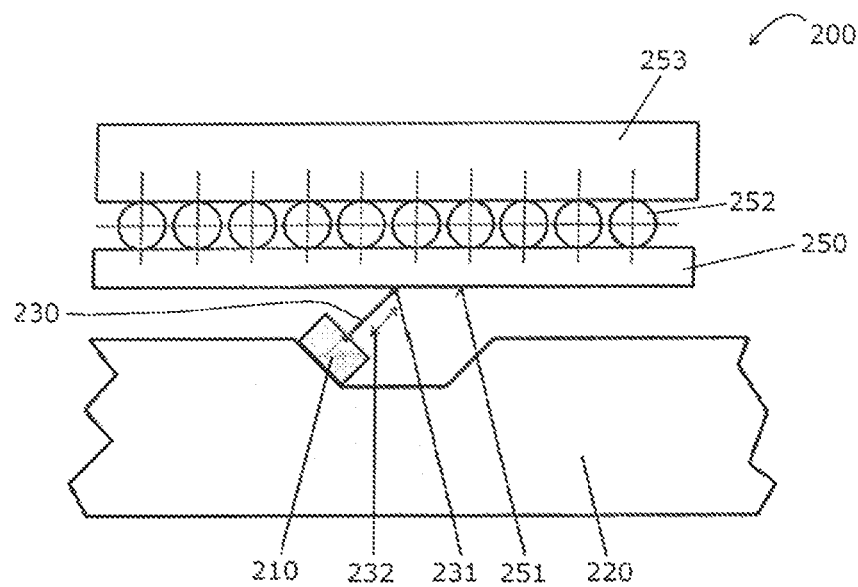
FIG. 13 is a schematic illustration of an exemplary electromechanical actuator designed as a piezoelectric motor having a base part, an oscillation resonator, a driver member and a slider.

FIG. 13 illustrates the fundamental principle of an electromechanical actuator 200 designed as an inertial motor. A deformable body 210, e.g. the oscillation resonator 10, is attached to a fixed base part or frame 220. A driver member 230 is mechanically coupled to the deformable body 210. The tip 231 of the driver member 230 may be pressed into frictional contact with a frictional surface 251 of a slider 250. The slider 250 may be suspended on a bearing 252 to be linearly movable in the left and/or right direction relative to a slider frame 253.

When the deformable body 210 is actuated into a motional oscillation along the arrow 232 at a sufficiently high frequency, the tip 231 periodically engages and disengages from the frictional surface 251 of the slider 250. Under the effect of the periodic frictional engagement/disengagement of the tip 231 through the periodic motional oscillation of the actuated deformable body 210, the frictional surface 251 and thus the slider 250 obtains a continuous motion. The periodical disengagement of the tip 231 from the frictional surface 251 is due to the much larger inertia of the slider 250 and base part 220 compared to inertia of the deformable body 210 and the driver member 230. In this situation the tip 231 periodically transfers an impulse to the slider 250 and the slider 250 will move if it experiences a component of impulse along its sliding axis (in FIG. 13 in the horizontal direction). The direction of motion depends on the sign of the angle between the sliding axis and the arrow 232 indicating the direction of vibrational movement of the driver member 230.

Figure 14:
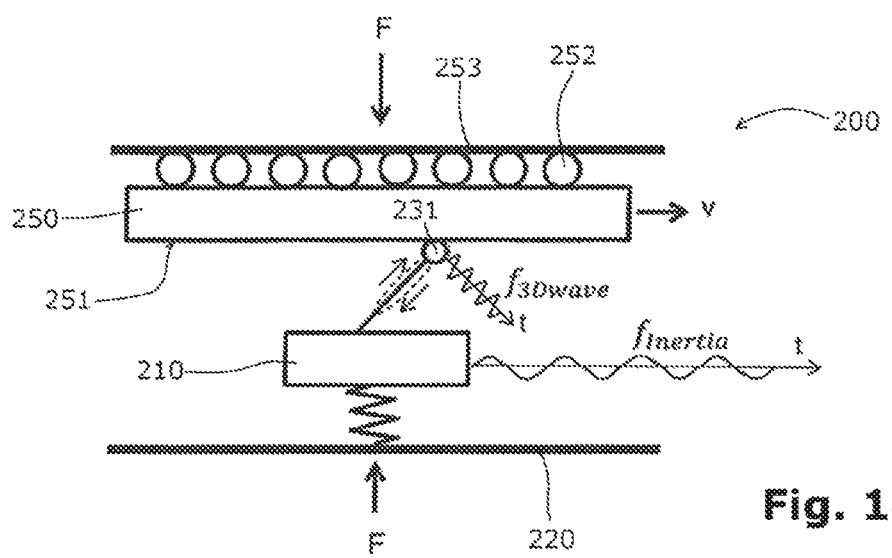
FIG. 14 is a schematic illustration of an exemplary electromechanical actuator for explanation of the inertial motion principle.

FIG. 14 illustrates the force, frequency, velocity and time quantities involved in the operation of the electromechanical actuator 200. F denotes the pressure force acting between the slider 250 and the base part 220. The deformable body 210 is oscillating in time t in the same direction as the applied force F. The driver member 230, which is mechanically connected to the deformable body 210, may be configured to move in a direction 232 oblige to the direction of the applied force F. The frequency of the 3D asymmetric vibrational standing wave generated in the deformable body 210 is denoted by $f_{3Dwave}$. As shown in FIG. 14, the slider 250 is moved in the right direction with a velocity v.

Figure 15:
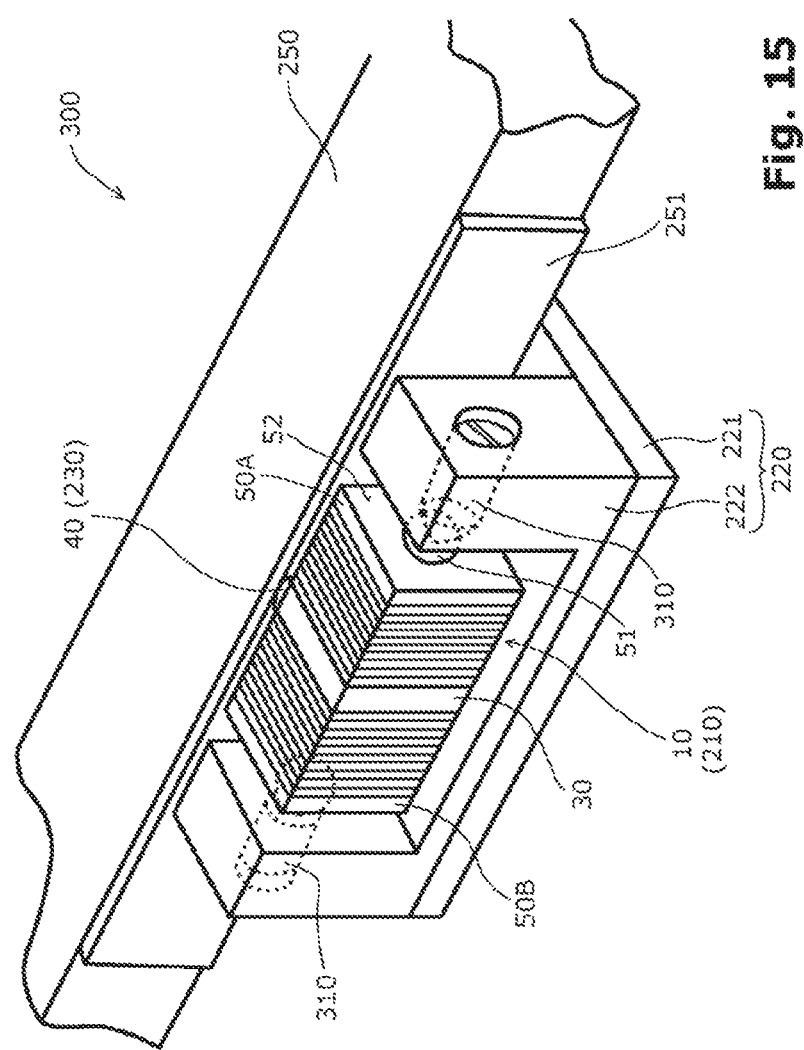
FIG. 15 is a perspective view of an exemplary electromechanical actuator in accordance with an exemplary embodiment.

FIG. 15 illustrates an exemplary electromechanical actuator 300. The oscillation resonator 10 used as the deformable body 210 is mounted to the base part 220 which may, e.g., comprise a plate 221 and a U-shaped part 222 attached to the plate 221. The oscillation resonator 10 may be mounted via a mount 310 to the base part 220, e.g. to the U-shaped part 222 thereof. The mount 310 may be configured to mount the oscillation resonator 10 so as to be rotatable around the axis of the oscillation resonator 10 rod relative to the base part 220. Byway of example, the mount 310 may be implemented by pins fixed to the flanges of the U-shaped part 220 and inserted into the bearing elements 51 formed, e.g., by receive spheres disposed in the end surfaces 52 of the end plates 50A, 50B.

As shown in FIG. 15, the driver member 230 of FIGS. 13, 14 may be implemented by the driver member 40 which may be formed by a peripheral zone of the "dead" plate 30 protruding out of the surface of the oscillation resonator 10. The tip 231 of the driver member 230 (see FIGS. 14, 15) may be implemented by a rounded edge region of the driver member 40.

FIGS. 16 and 17 illustrate further electromechanical actuators 300' and 300", respectively, which are similar to electromechanical actuator 300. All details described in relation to any of the actuators 300, 300' and 300" can be interchanged and combined, unless stated otherwise.

The frictional surface 251 of the slider 250 may be designed to be spring-loaded. By way of example, the frictional surface 251 may extend along a strip of a leaf spring 350.

The spring load, e.g. provided by leaf spring 350, may be configured to press the frictional surface 251 against the driver member 40. On the other hand, as the oscillation resonator 10 can rotate along it longitudinal axis, this degree of freedom allows the driver member 40 to automatically align with the frictional surface 251 of the slider 250. This positional self-alignment between the frictional surface 251 and the rotational orientation of the driver member 40 is an advantage in manufacturing cost and reliability. In particular, the controllability of the movement operation significantly increases and uneven wear at the frictional contact and misadjustment over time decreases. The positional self-alignment diminishes the manufacturing tolerances and hence the production costs. It is to be noted that a conventional 2D wave plate resonator would not allow for self-alignment of a driver member with a friction surface.

Various different implementations are possible. The electromechanical actuator 300' of FIG. 16 exemplifies an implementation in which the base part 220 to which the oscillation resonator 10 is mounted may slide relative to a fixed frame to which the frictional surface 251 is fixedly mounted. In this case, the "slider" 250 may be considered to represent a stationary frame and the "base part" 220 may be considered to be movable relative to the frame the slider. The electromechanical actuator 300" of FIG. 17 exemplifies an implementation in which either the base part 220 or the slider 250 may be stationary (i.e. a fixed frame) and the other of these parts may be designed to move relatively to the fixed part, i.e. as a "slider".

Further, it is to be noted that the frictional surface 251 may be straight or rounded. If rounded, the vibrational deformation of the oscillation resonator 10 translates into a rotational movement. Generally speaking, the 3D wave deformable oscillation resonator 10 may be used as a propulsion unit for linear movement or rotational movement. Directional movement may be caused by the symmetry breaking associated with the generation of an asymmetric bulk wave. By way of example, a rotator (not shown) having a full-perimeter frictional surface 251 may be used instead of the slider 250. The direction of rotation may, e.g., be reversed by operating the selection switch 85.

EXAMPLES

Example 1 of the disclosure relates to an electromechanical actuator, comprising: an oscillation resonator having the shape of a rod, the oscillation resonator being divided by a dividing plane that is not parallel to the longitudinal direction of the oscillation resonator into a first resonator portion and a second resonator portion, wherein at least the first resonator portion comprises electromechanical means which, when activated, are configured to generate a 3-dimensional acoustic bulk wave with a mode shape asymmetric with respect to the dividing plane.

Example 2 relates to the subject matter of example 1, wherein the second resonator portion also comprises electromechanical means, and the electromechanical means of the first and second resonator portions are configured to be activated independently from each other.

Example 3 relates to the subject matter of example 1 or 2, wherein the 3-dimensional bulk wave is radially symmetric in any cross section normal to the longitudinal direction of the oscillation resonator.

Example 4 relates to the subject matter of one of the preceding examples, wherein the rod-shaped oscillation resonator is of a cross section which is nearly or completely a circular disc or a regular polygon, in particular a square.

Example 5 relates to the subject matter of one of the preceding examples, wherein the oscillation resonator has a length L, a first lateral dimension W and a second lateral dimension H in a direction perpendicular to the first lateral dimension W, and wherein the first lateral dimension W and the second lateral dimension H are different from each other by equal to or less than 15%, 10%, 5% or 0%.

Example 6 relates to the subject matter of one of the preceding examples, wherein the oscillation resonator has a length L, a first lateral dimension W and a second lateral dimension H in a direction perpendicular to the first lateral dimension W, and wherein L is different from W+H by equal to or less than 30%, 15%, 10%, 5% or 0%.

Example 7 relates to the subject matter of one of the preceding examples, wherein the first resonator portion has a length L1, a first lateral dimension W1 and a second lateral dimension H1 in a direction perpendicular to the first lateral dimension W1, the second resonator portion has a length L2, a first lateral dimension W2 and a second lateral dimension H2 in a direction perpendicular to the first lateral dimension W2, and L1, L2 and/or W1, W2 and/or H1, H2 are different from each other by equal to or less than 30%, 15%, 10%, 5% or 0%.

Example 8 relates to the subject matter of one of the preceding examples, wherein the electromechanical means of the first resonator portion comprises a first piezoelectric stack having first electrode layers and first piezoelectric layers disposed therebetween, and a polarization vector of a first piezoelectric layer has a component extending in the longitudinal direction of the oscillation resonator.

Example 9 relates to the subject matter of example 8, wherein the oscillation resonator, when activating the first piezoelectric stacks in a non-oscillating condition, is configured to generate a controllable non-oscillating displacement of the first resonator portion in the longitudinal direction of the oscillating resonator.

Example 10 relates to the subject matter of one of the examples 8 or 9, wherein the electromechanical means of the second resonator portion comprises a second piezoelectric stack having second electrode layers and second piezoelectric layers disposed therebetween, a polarization vector of a second piezoelectric layer has a component extending in the longitudinal direction of the oscillation resonator, the electrode layers of the first piezoelectric stack and the electrode layers of the second piezoelectric stack each comprise a first group of electrode layers and a second group of electrode layers, the electrode layers of the first group and the second group are interlaced, the electrode layers of the first groups are electrically interconnected and the electrode layers of the second groups are electrically separated and configured to be individually excited.

Example 11 relates to the subject matter of one of the preceding examples, further comprising: a driver member mechanically coupled to the oscillation resonator; and a slider or rotator configured to be moved by the driver member when the oscillation resonator is excited.

Example 12 relates to the subject matter of example 11, wherein the driver member is configured to engage with a friction surface of the slider or rotator via a frictional contact.

Example 13 relates to the subject matter of example 12, wherein the friction surface of the slider or rotator is spring loaded to control the frictional contact between the driver member and the friction surface.

Example 14 relates to the subject matter of one of examples 11 to 13, further comprising: a base part, and a mount for mounting the oscillation resonator to the base part, wherein the mount is configured to bear the oscillation resonator so as to be rotatable around an axis of the rod relative to the base part.

Example 15 of the disclosure relates to a method of moving an object relative to a base part, the method comprises: providing an oscillation resonator having the shape of a rod, the oscillation resonator being divided by a dividing plane that is not parallel to the longitudinal direction of the oscillation resonator into a first resonator portion and a second resonator portion, wherein at least the first resonator portion comprises electromechanical means; and activating the electromechanical means so as to generate a 3-dimensional acoustic bulk wave with a mode shape asymmetric with respect to the dividing plane.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:
1. An electromechanical actuator, comprising:
a base part;
an oscillation resonator having the shape of a rod;
a mount for mounting the oscillation resonator to the base part, wherein the mount is configured to bear the oscillation resonator so as to be rotatable around an axis of the oscillation resonator rod relative to the base part;

a driver member mechanically coupled to the oscillation resonator; and a slider or a rotator configured to be moved by the driver member when the oscillation resonator is excited.

2. The electromechanical actuator of claim 1, wherein the driver member is configured to engage with a friction surface of the slider or the rotator via a frictional contact.

3. The electromechanical actuator of claim 2, wherein the friction surface of the slider or the rotator is spring loaded to control the frictional contact between the driver member and the friction surface.

4. The electromechanical actuator of claim 1, wherein a pressure force is acting between the slider or the rotator and the base part.

5. The electromechanical actuator of claim 1, wherein the slider is suspended on a bearing to be linearly movable in one or both of the left and right direction relative to a slider frame.

6. The electromechanical actuator of claim 1, wherein the base part comprises a plate and a U-shaped part attached to the plate.

7. The electromechanical actuator of claim 1, wherein a spring load is configured to press a frictional surface of the slider or the rotor against the driver member.

8. The electromechanical actuator of claim 7, wherein the frictional surface of the slider extends along a strip of a leaf spring.

9. The electromechanical actuator of claim 1, wherein the oscillation resonator is configured to rotate around its longitudinal axis.

10. The electromechanical actuator of claim 9, wherein the rotation around its longitudinal axis allows the driver member to automatically align with the frictional surface of the slider.

11. The electromechanical actuator of claim 1, wherein the driver member is formed by a peripheral zone of a plate protruding out of a surface of the oscillation resonator.

12. The electromechanical actuator of claim 1, wherein the base part is stationary and the slider is designed to move relatively to the stationary base part.

13. The electromechanical actuator of claim 1, wherein the slider is stationary and the base part is designed to move relatively to the stationary slider.

14. The electromechanical actuator of claim 1, wherein the oscillation resonator is a 3D acoustic wave oscillation resonator used as a propulsion unit for linear movement or a rotational movement.

15. The electromechanical actuator of claim 1, wherein the oscillation resonator is an oscillation resonator having the shape of a rod, the oscillation resonator being divided by a dividing plane that is not parallel to the longitudinal direction of the oscillation resonator into a first resonator portion and a second resonator portion, wherein at least the first resonator portion comprises electromechanical means which, when activated, are configured to generate a 3-dimensional acoustic bulk wave with a mode shape asymmetric with respect to the dividing plane.

* * * * *